United States Patent [19]

Martin

[11] 4,109,922

[45] Aug. 29, 1978

[54] SEALING DEVICE FOR A VACUUM ENCLOSURE

[75] Inventor: Philippe Martin, Orsay, France

[73] Assignee: Soudure Autogene Francaise, Paris, France

[21] Appl. No.: 790,884

[22] Filed: Apr. 26, 1977

[30] Foreign Application Priority Data

Apr. 28, 1976 [FR] France .............................. 76 12571

[51] Int. Cl.² .............................................. F16J 15/10
[52] U.S. Cl. ..................................... 277/34.3; 277/180
[58] Field of Search .......................... 277/34, 34.3, 180

[56] References Cited

U.S. PATENT DOCUMENTS 3,248,119 4/1966 Smith et al. .......................... 277/180
3,258,271 6/1966 Hollingsworth ..................... 277/34.3

Primary Examiner—Robert I. Smith
Attorney, Agent, or Firm—Cameron, Kerkam, Sutton, Stowell & Stowell

[57] ABSTRACT

The sealing device is adapted to a vacuum enclosure which can be applied against a bearing surface and essentially comprises at least two concentric seals mounted in a support which is rigidly fixed to said enclosure and extending parallel to the bearing surface. One seal consists of a solid annular seal made of flexible material and placed near the outer edge of the enclosure. The other seal consists of a hollow and inflatable annular seal which is placed near the inner edge of the enclosure and is connected to a source of fluid under pressure by means of a closable duct.

3 Claims, 6 Drawing Figures

SEALING DEVICE FOR A VACUUM ENCLOSURE

This invention relates to a sealing device for an enclosure in which a vacuum is produced in order to permit of effective separation between the inner region of said enclosure and the outer region in which atmospheric pressure usually prevails.

The invention is more especially applicable to a bell-shaped vacuum enclosure of the suction-cup type which is so designed as to be applied against or to surround a flat part or a part having a skew surface or cambered surface. This type of enclosure can be employed for the purpose of producing a suitable vacuum in the region defined by the bell-chamber and the part, for example in order to carry out a beam welding operation on said part or within said enclosure.

In constructional arrangements of this type which are already known, the bell-shaped enclosure is intended to be applied against the part by means of a flange fitted with an O-ring seal which serves to isolate the interior from the exterior. However, in order to ensure that a sufficient primary vacuum of the order of $10^{-3}$ torr, for example, can be produced within the bell-chamber, it is usually essential to carry out a preliminary machining operation on the flat part within that zone of this latter which serves as a bearing surface for the bell-chamber in order to obtain a perfectly flat and flawless state of surface while also making use of means for ensuring strictly accurate positioning of the bell-chamber with respect to the zone which has just been machined.

This invention relates to a sealing device for a vacuum enclosure which readily makes it possible to attain the desired primary vacuum within said enclosure without any need to take special precautions in regard to positioning of the enclosure or to provide machined surfaces which do not exhibit flaws or irregularities of any kind.

To this end, the sealing device under consideration is adapted to a vacuum enclosure which can be applied against a bearing surface and essentially comprises at least two concentric annular seals mounted in a support which is rigidly fixed to said enclosure and extending parallel to the bearing surface. One annular seal is placed near the exterior of the enclosure and is a solid seal made of flexible material. The other annular seal is placed near the interior of the enclosure and is a hollow inflatable seal connected by means of a closable duct to a source of fluid under pressure.

The use of inflatable seals has already been contemplated in some designs of vacuum enclosures or handling appliances. Seals of this type usually have a large cross-sectional area. When they are applied against the surface to be sealed, these seals accordingly make it possible to absorb surface irregularities or defects of surface flatness in an appreciably more efficacious manner than solid seals. However, it proves a matter of difficulty to initiate a pumping operation in order to produce a vacuum within the enclosure by reason of the fact that seals of this type become efficient only after they have been inflated to their nominal utilization pressure. In point of fact, these seals stiffen at this pressure and have a tendency to lift the enclosure with respect to that flat surface on which it is applied, thus immediately preventing any reduction in pressure.

The design solution proposed by the present invention overcomes the disadvantage just mentioned. A reduction in pressure can in fact be initiated in a suitable manner by means of the solid outer seal of flexible material of the neoprene type, for example, whilst retraction of the inflatable seal accordingly takes place during this fall of pressure. Once a vacuum is created, said inflatable seal is put under a sufficiently high pressure and the area of application of said seal against the bearing surface is calculated so as to ensure that the seal is not in any way liable to lift the enclosure. Said inflatable seal is then intimately applied against the flat surface while removing in particular any surface irregularities and forming an effective leak-tight barrier which makes it possible for the reduction in pressure to continue to the desired value. The outer seal can consist either of a single element or of two similar seals in adjacent and concentric relation.

In accordance with a particular arrangement, the solid outer seal has a portion which is directed towards the bearing surface in the shape of a dihedron, thus facilitating compression of the seal at the time of creation of a vacuum within the enclosure. As an advantageous feature, compression of the solid seal is limited by a lateral abutment member which is carried by the support and disposed at right angles to the bearing surface.

In accordance with another distinctive feature, the inflatable inner seal is mounted within an open housing which is formed in the support opposite to the bearing surface, said inflatable seal being connected by means of a duct to two branch pipes each fitted with a shut-off valve and adapted to communicate respectively on the one hand with the interior of the enclosure and on the other hand with the source of fluid under pressure.

Further distinctive features of a sealing device for a vacuum enclosure in accordance with the invention will become apparent from the following description of one exemplified embodiment which is given by way of indication and not in any limiting sense, reference being made to the accompanying drawings, wherein.

Figure 1:
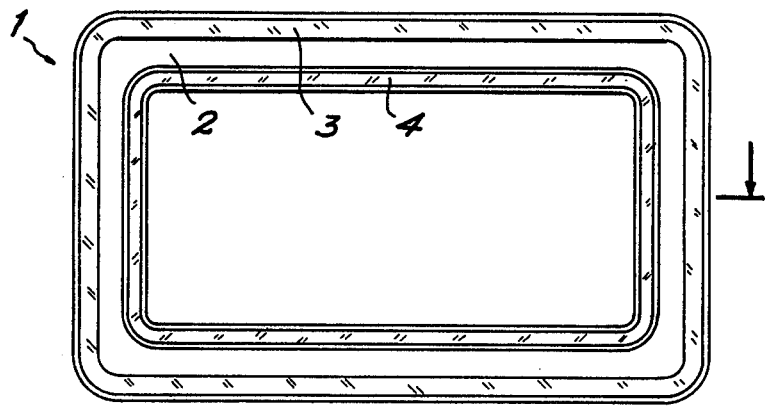
FIG. 1 is a bottom view of a bell-type enclosure fitted with two seals in accordance with the invention.
Figure 2:
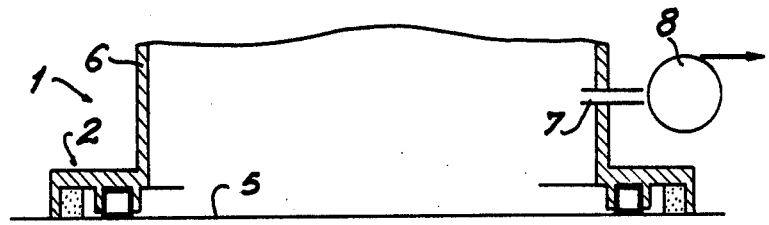
FIG. 2 is a longitudinal sectional view of that portion of the enclosure which is fitted with the seals.

The enclosure illustrated in FIGS. 1 and 2 is generally designated by the reference 1. One edge of the enclosure has a flat transverse flange 2 which forms a support for two concentric seals designated respectively by the references 3 and 4. The seal 3 is mounted externally of the enclosure 1 and the seal 4 is mounted internally of this latter. Said seals are carried by the support flange 2 in such a manner as to project towards a flat bearing surface 5 against which the enclosure 1 is intended to be applied in order to ensure in conjunction with this latter the confinement of a given volume in which a vacuum is intended to be produced. In particular, the enclosure 1 can be so arranged as to surround parts to be welded by the known beam-welding process. It must be possible in all cases to produce a suitable vacuum of the order of at least $10^{-3}$ torr within the internal region of the enclosure 1. Pumping of the atmosphere within the enclosure is carried out by connecting an orifice formed through the lateral wall 6 of said enclosure to a suction pipe 7, said pipe being connected to a pump set 8 as shown diagrammatically in FIG. 1.

Figure 3:
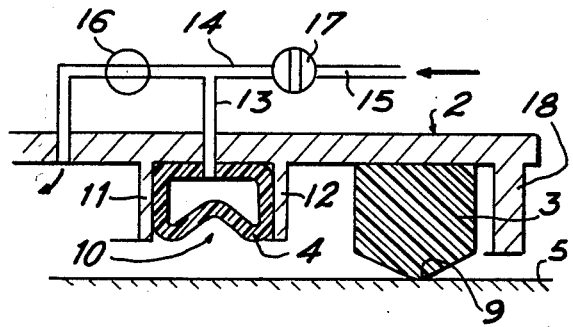
FIGS. 3, 4, 5 and 6 are detail views to a larger scale which serve to illustrate the operations of the seals under consideration during utilization of the enclosure.
Figure 4:
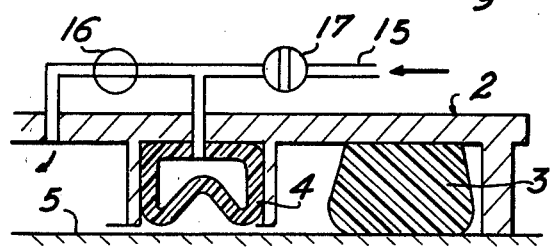

In accordance with the invention, the seals 3 and 4 carried by the flange 2 are of substantially different composition and structure. The shape as well as the mode of utilization of said seals are illustrated in greater detail in FIGS. 3 to 5. The outer seal 3 in particular is designed in the form of a solid annular seal of flexible material, especially of neoprene, a seal of this type being currently employed in vacuum handling appliances. In that portion which is directed towards the flat bearing surface 5, said seal preferably has a dihedron 9 which is intended to facilitate compression of said seal as a vacuum is being produced within the enclosure and as the support flange 2 consequently moves towards the surface 5 (as shown in FIGS. 3 and 4). So far as the inner seal 4 is concerned, this latter is constituted by an inflatable seal mounted within an open housing 10 delimited by two collars 11 and 12 formed in the surface of the flange 2. Said inflatable seal 4 is connected by means of a duct 13 which extends through the flange 2 to two branch pipes 14 and 15 fitted respectively with two shut-off valves 16 and 17. The branch pipe 14 extends beyond the valve 16 and has its opening within the enclosure whilst the branch pipe 15 is connected to a source of fluid for inflating to a suitable pressure (not shown in the drawings). Finally, provision is made at the periphery of the support flange 2 for a lateral abutment member 18 for limiting the displacement of said flange 2 in the direction of the bearing surface 5 at the time of evacuation of the enclosure. Said abutment member 18 is formed by a collar which is welded to the flange so as to extend at right angles to the plane of the surface 5.

Figure 5:
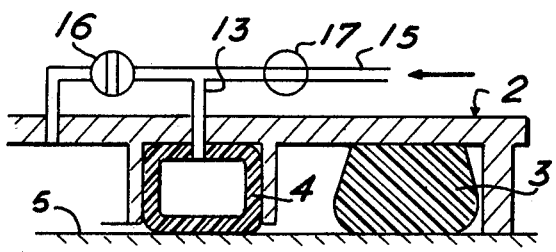

The practical application of the sealing device thus formed can more especially be deduced from a study of FIGS. 3 to 5. In a first stage, the enclosure 1 which is fitted within its support flange 2 with the seals 3 and 4 is brought into the proximity of the surface 5 against which it is intended to be applied, either in order to ensure continuity of the enclosure and evacuation of this latter prior to a beam-welding operation or in order to adopt the same procedure for handling any part which is provided with said surface 5. Under these conditions, that face 9 of the solid joint 3 which has the shape of a dihedron comes into contact with the surface 5 and is progressively compressed under the action of the movement of approach of the flange 2 which results both from the weight of the enclosure and from initial production of a vacuum within this latter by means of the duct 7 and the pump set 8 (as shown in FIG. 2).

The movement of approach of the flange 2 continues until the lateral abutment member 18 of said flange comes into contact with the surface 5. Under these conditions, the solid seal 3 is in the position illustrated in FIG. 4. During this operation, the inflatable seal 4 is maintained in the retracted position, the atmosphere contained therein being pumped through the communication established by the branch pipe 14 with the interior of the enclosure 1. To this end, the valve 16 is opened and the valve 17 is closed as illustrated in FIGS. 3 and 4. Evacuation of the enclosure continues until the pressure within this latter attains substantially one-half the value of atmospheric pressure.

In the following stage, the mode of utilization of the inflatable seal 4 is such that this latter is in turn applied against the flat surface 5 in order to absorb the surface defects of this latter and to permit continued evacuation of the enclosure. To this end, the valve 16 is closed and the valve 17 is opened, with the result that the pressurized inflating fluid is capable of inflating the seal 4 through the branch pipe 15, that said seal then stiffens and is applied against the surface 5. Evacuation of the enclosure by the pump set 8 is then continued until the desired degree of vacuum is attained, this value being usually in the vicinity of $10^{-3}$ torr.

In all cases, the inflatable seal 4 must be so determined that pressurization of this latter as illustrated in FIG. 5 does not give rise to lifting of the enclosure 1 and consequently to release of the vacuum created within this latter.

Under these conditions, if the pressure within the enclosure is of the order of one-half the atmospheric pressure prior to utilization of the inflatable seal, the force which applies the enclosure against the bearing surface can be written:

$$F_1 = \tfrac{1}{2} Pa \, (L \times 1) \tag{1}$$

where $Pa$ is the atmospheric pressure, L and 1 are the dimensions in length and in width of the enclosure in the example illustrated in the figures, in which the flange 2 is shown as having a rectangular shape.

If the nominal pressure of the compressed fluid fed into the inflatable seal 4 is equal to P, the force which will tend to lift the enclosure can be written:

$$F_2 = P \times 2 \, (L + 1) \, e, \tag{2}$$

where $e$ is the area of application of the inflatable seal 4 on the surface 5.

Said area of application $e$ will therefore be determined by design so that we have in all cases:

$$F_1 > F_2 \tag{3}$$

whence $$e < \frac{Pa}{4P} \times \frac{L \cdot 1}{(L + 1)} \tag{4}$$

In respect of any value of $e$ which satisfies the condition given above, the inflatable seal will be incapable of lifting the enclosure. Said seal will accordingly take up the entire available space between its housing and the bearing surface by being intimately applied against this latter and by thus absorbing all surface irregularities, thereby achieving satisfactory containment of the primary vacuum created within the enclosure.

Figure 6:
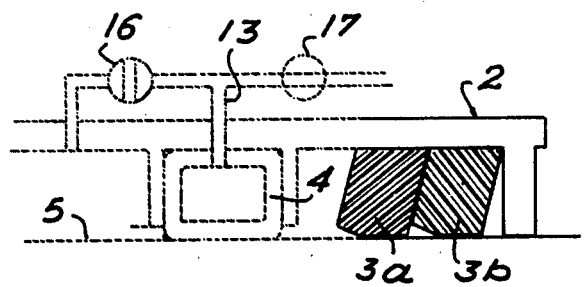

It will readily be apparent that the invention is not limited to the exemplified embodiment which has been more especially described in the foregoing with reference to the accompanying drawings but extends on the contrary to all alternative forms. In particular, the solid outer seal 3 of flexible material can be constituted by two similar seals in adjacent and concentric relation such as those designated in FIG. 6 by the references 3a and 3b, in which the seals are in the position corresponding to the single seal 3 shown in FIG. 5. In this case, said seals can be so arranged that, at the time of relative compression, said seals apply a substantially flat face against the bearing surface, with the result that the sealing contact is accordingly improved.

What we claim is:

1. A sealing device for a vacuum enclosure which can be applied against a bearing surface comprising at least two concentric annular seals mounted in a support rigidly fixed to said enclosure and extending parallel to said bearing surface, one of said annular seals being near the exterior of said enclosure and being a solid seal of flexible material, the other of said annular seals being near the interior of said enclosure and being a hollow inflatable seal, a closable duct connecting said inflatable seal to a source of fluid under pressure, said solid seal having a portion having the shape of a dihedron and directed towards said bearing surface to facilitate compression of said seal when a vacuum is drawn within said enclosure, a lateral abutment member carried by said support and disposed at right angles to said bearing surface limiting compression of said solid seal, an open housing for said inflatable seal in said support opposite said bearing surface, said duct connecting to two branch pipes and a shut-off valve for each of said pipes for communication respectively with the interior of said enclosure and with said source of fluid under pressure.

2. A sealing device according to claim 1 wherein said bearing surface is a flat surface and also a skew surface and also a cambered surface.

3. A sealing device according to claim 1 wherein said solid seal includes two similar seal portions in adjacent and concentric relation.

* * * * *